(12) United States Patent
Kim et al.

(10) Patent No.: US 7,537,401 B2
(45) Date of Patent: May 26, 2009

(54) PHOTO APPARATUS AND METHOD

(75) Inventors: Yong Hun Kim, Paju-si (KR); Jin Woo Seo, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 248 days.

(21) Appl. No.: 11/639,328

(22) Filed: Dec. 15, 2006

(65) Prior Publication Data
US 2007/0280680 A1   Dec. 6, 2007

(30) Foreign Application Priority Data
Jun. 5, 2006   (KR) .................. 10-2006-0050468

(51) Int. Cl.
*G03D 5/00* (2006.01)
*G03B 27/32* (2006.01)
(52) U.S. Cl. ....................... 396/611; 355/27
(58) Field of Classification Search .............. 355/27, 355/40; 396/611; 118/58, 300, 663–666
See application file for complete search history.

(56) References Cited

U.S. PATENT DOCUMENTS

| 2002/0011207 A1* | 1/2002 | Uzawa et al. ............... 118/666 |
| 2003/0147643 A1 | 8/2003 | Miyata et al. |
| 2005/0101050 A1 | 5/2005 | Park |
| 2005/0200818 A1* | 9/2005 | Ryu et al. ..................... 355/53 |

OTHER PUBLICATIONS

European Search Report.

* cited by examiner

*Primary Examiner*—Hung Henry Nguyen
(74) *Attorney, Agent, or Firm*—McKenna Long & Aldridge LLP

(57) ABSTRACT

A photo process apparatus including: a loading/unloading unit that loads and unloads a substrate; a coating line that coats photoresist on the substrate; an exposure line that exposes the photoresist coated on the substrate; a development line that develops the exposed substrate; and a transferring line that temporarily stores the substrate coated with the photoresist and loads the substrate coated with the photoresist to the exposure line and temporarily stores the exposed substrate and loads the exposed substrate to the development line.

22 Claims, 3 Drawing Sheets

PHOTO APPARATUS AND METHOD

This application claims the benefit of Korean Patent Application No. P2006-50468, filed on Jun. 5, 2006, which is hereby incorporated by reference as if fully set forth herein.

BACKGROUND OF THE INVENTION

1. Field of the Invention

The present invention relates to a photo apparatus and method, and more particularly, to a photo apparatus and method to enhance yield by minimizing the entire layout of photo process line.

2. Discussion of the Related Art

Generally, a photo process is used for patterning a substrate when fabricating semiconductor devices, flat display devices, etc. The photo process includes coating a photoresist on a substrate, exposing the photoresist coated onto the substrate, and developing the exposed substrate. When the exposing the photoresist, the coated photoresist is selectively exposed.

FIG. 1 is a layout schematically illustrating a related art photo apparatus.

As shown in FIG. 1, the related art photo apparatus is provided with a loading/unloading unit 10 that loads or unloads a substrate; a cleaning unit 20 that cleans the substrate; a coating line that coats a photoresist onto the cleaned substrate; an exposure unit 110 that applies an exposure process to the photoresist coated onto the substrate; a titler 120 that forms an identification code on the exposed substrate; and a development line that applies a development process to the substrate via the titler 120.

The loading/unloading unit 10 loads the substrate into the cleaning unit 20 after taking the substrate from a cassette being moved by a conveying device. Also, the loading/unloading unit 10 unloads the substrate from the development line, and then loads the substrate into the cassette.

The cleaning unit 20 cleans the substrate that is loaded by the loading/unloading unit 10. The cleaning unit 20 has a cleaning conveyor that conveys the substrate to the coating line and a cleaning part that sprays a cleaning solution onto the substrate conveyed so as to clean the substrate.

The coating line includes: a first robot arm 30 that takes the cleaned substrate out from the cleaning unit 20; a dehydration bake unit (DHP) 40 that dehydrates the substrate supplied by the first robot arm 30; a first conveyor 50 that conveys the dehydrated substrate; a coating unit 60 that coats the photoresist onto the substrate conveyed by the first conveyor 50; a vacuum dryer (VCD) 70 that hardens the photoresist coated on the substrate; a solvent remover 80 that removes solvent from the substrate; a buffer 90 that temporarily stores the substrate from which the solvent is removed; a temperature reducer 92 that reduces the temperature of the substrate supplied from the buffer 90; and a second robot arm 100 that provides the substrate from the buffer 90 to the temperature reducer 92, loads the substrate having the reduced temperature to the exposure unit 110, takes the exposed substrate out from the exposure unit 110, and loads the exposed substrate to the titler 120.

The first robot arm 30 takes the cleaned substrate out from the cleaning unit 20, and loads the cleaned substrate to the dehydration bake unit 40. Also, the first robot arm 30 takes the dehydrated substrate out from the dehydration bake unit 40, and loads the dehydrated substrate to the first conveyor 50.

The dehydration bake unit 40 is formed of a hot plate that is heated at a temperature between about 110° C. and about 130° C. Also, the dehydration bake unit 40 dehydrates the substrate, loaded by the first robot arm 30, using the hot plate.

The first conveyor 50 conveys the dehydrated substrate loaded by the first robot arm 30 to the coating unit 60.

The coating unit 60 includes: a third robot arm 62 that takes the substrate from the first conveyor 50; a coater 64 that coats the photoresist on the substrate loaded by the third robot arm 62; and a fourth robot arm 66 that takes the substrate from the coater 64 and loads the same into the VCD 70, takes the substrate from the VCD 70, and loads the same into the solvent remover 80.

The third robot arm 62 takes the substrate from the first conveyor 50 and loads the substrate into the coater 64. The coater 64 coats the photoresist on the substrate loaded by the third robot arm 62.

After the coater 64 coats the photoresist on the substrate, the fourth robot arm 66 takes the substrate coated with the photoresist out from the coater 64 and loads the same the vacuum dryer 70 into the vacuum dryer 70. Also, after the vacuum dryer 70 hardens the photoresist coated on the substrate, the fourth robot arm 66 takes the hardened substrate out of the vacuum dryer 70 and loads the same into the solvent remover 80.

The vacuum dryer 70 dries the photoresist of the substrate loaded by the fourth robot arm 66 in a low vacuum state.

The solvent remover 80 includes a solvent-removing oven 82 that removes the solvent from the substrate with a softbake hot plate (SHP) and a fifth robot arm 84 that takes the substrate out of the solvent-removing oven 82 and loads the same into the buffer 90.

The solvent-removing oven 82 removes the solvent from the substrate loaded by the fourth robot arm 66 with the SHP, and the substrate is heated to a temperature between about 110° and about 130°.

After removing the solvent from the substrate in the solvent-removing oven 82, the fifth robot arm 84 takes the substrate having no solvent out of the solvent-removing oven 82 and loads the same into the buffer 90.

The buffer 90 temporarily stores the substrate loaded by the fifth robot arm 84.

The temperature reducer 92 lowers the temperature of the substrate loaded by the fifth robot arm 84 to about 23° C. The temperature reducer 92 may be formed in a dual-layered structure including a cool plate.

The second robot arm 100 takes the substrate that is temporarily stored out of the buffer 90 and loads the same into the temperature reducer 92. Also, as the temperature of the substrate is decreased by the temperature reducer 92, the second robot arm 100 takes the substrate having the decreased temperature of the temperature reducer 92 and loads the same to the exposure unit 110. Also, the second robot arm 100 takes the exposed substrate out of the exposure unit 110 and loads the same into the titler 120.

The exposure unit 110 arranges the substrate loaded by the second robot arm 100 and patterns the photoresist on the substrate by applying light to the arranged substrate.

The titler 120 forms the identification code at one side of the substrate loaded by the second robot arm 100. At this time, the titler 120 is provided on the conveyor, so as to form the identification code on the conveyed substrate.

The development line includes: a developing unit 130 that develops the substrate; a drying unit 140 that dries the developed substrate; a turn-conveyor that turns the conveying direction of the dried substrate; and a second conveyor 160 that conveys the turned substrate to the loading/unloading unit 10.

The developing unit 130 develops the substrate that is exposed by the exposure unit 110 and is provided with the identification code formed by the titler. The developing unit 130 includes a developing conveyor connected to the titler 120 and a developing part that develops the substrate by spraying a developer onto the developing conveyor.

The drying unit 140 includes a drying oven 142 that dries the developed substrate by using a hard hot plate (HHP) and a sixth robot arm 144 that takes the substrate out from the drying oven 142 and loads the same to the turn-conveyor 150.

The drying oven 142 heats and dries the substrate conveyed by the developing conveyor of the developing unit 130 with the HHP that is heated to a temperature between about 110° and about 130°.

After the drying oven 142 dries the substrate, the sixth robot arm 144 takes the substrate from the drying oven 142 and loads the same to the turn-conveyor 150.

The turn-conveyor 150 turns the conveying direction of the substrate loaded by the sixth robot arm 144 toward the second conveyor 160. The second conveyor 160 conveys the substrate turned by the turn-conveyor 150 to the loading/unloading unit 160.

The related art photo apparatus includes the cleaning unit 20, the coating line, the exposure unit 110, the titler 120, and the development line, that are arranged in one line. Thus, the substrate loaded by the loading/unloading unit 10 is cleaned, coated, and exposed in series, and then the substrate progresses through the titling and development lines, whereby the photo process is completed.

However, the related art photo apparatus and method has the following disadvantages.

In the related art photo apparatus, the coating line and the exposure unit connected with the development line are formed as one photo line, whereby the entire layout is increased. Also, the coating line, the development line and the exposure line have the different processing times, so that a waiting time occurs, thereby increasing an entire processing time.

If there are problems in any one unit of the photo apparatus, the entire operation rate decreases. If the problems are in the exposure unit 110, it is impossible to operate the coating line, the titler and the development line.

SUMMARY OF THE INVENTION

Accordingly, the present invention is directed to a photo apparatus and method that substantially obviates one or more problems due to limitations and disadvantages of the related art.

An advantage of the present invention is to provide a photo apparatus and method to enhance the yield by minimizing an entire layout of photo process line.

Additional features and advantages of the invention will be set forth in part in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described herein, a photo process apparatus including: a loading/unloading unit that loads and unloads a substrate; a coating line that coats photoresist on the substrate; an exposure line that exposes the photoresist coated on the substrate; a development line that develops the exposed substrate; and a transferring line that temporarily stores the substrate coated with the photoresist and loads the substrate coated with the photoresist to the exposure line and temporarily stores the exposed substrate and loads the exposed substrate to the development line.

In another aspect of the present invention, a photo process apparatus including: a plurality of photo-process lines arranged in parallel, each photo-process line including a loading/unloading unit that loads or unloads a substrate, a coating line that coats photoresist on the substrate, an exposure line that exposes the photoresist coated on the substrate, and a development line that develops the exposed substrate; and a transferring line that transfers the substrate to the coating line, the exposure line, and the development line in each photo-process line according to the processing state of the photo-process line.

In another aspect of the present invention, a photo process method including: loading a substrate; coating a photoresist on the loaded substrate; temporarily storing the substrate coated with the photoresist; receiving the temporarily stored substrate, and exposing the substrate coated with the photoresist; temporarily storing the exposed substrate; receiving the temporarily stored substrate, and developing the exposed substrate; and unloading the developed substrate.

In another aspect of the present invention, a photo process method that includes a plurality of photo-process lines arranged in parallel, each photo-process line including a loading/unloading unit that loads or unloads a substrate, a coating line that coats photoresist on the substrate, an exposure line that exposes the photoresist coated on the substrate, and a development line that develops the exposed substrate, including: loading the substrates onto each coating line so as to coat the photoresist on each substrate; temporarily storing the substrates coated in each coating line by using a transferring line that transfers the substrate to the coating line, the exposure line and the development line; exposing the photoresist coated on the substrate by loading the substrate onto the exposure line for each photo-process line that requires the coated substrate through the transferring line; temporarily storing the exposed substrate from each exposure line by using the transferring line; developing the exposed substrate by loading the exposed substrate onto the development line for each photo-process line through the transferring line; and unloading the substrate using the loading/unloading unit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principle of the invention.

In the drawings.

DETAILED DESCRIPTION OF THE ILLUSTRATED EMBODIMENTS

Reference will now be made in detail to an embodiment of the present invention, example of which is illustrated in the accompanying drawings. Wherever possible, the same reference numbers will be used throughout the drawings to refer to the same or like parts.

Hereinafter, a photo apparatus and method according to the present invention will be explained with reference to the accompanying drawings.

Figure 1:
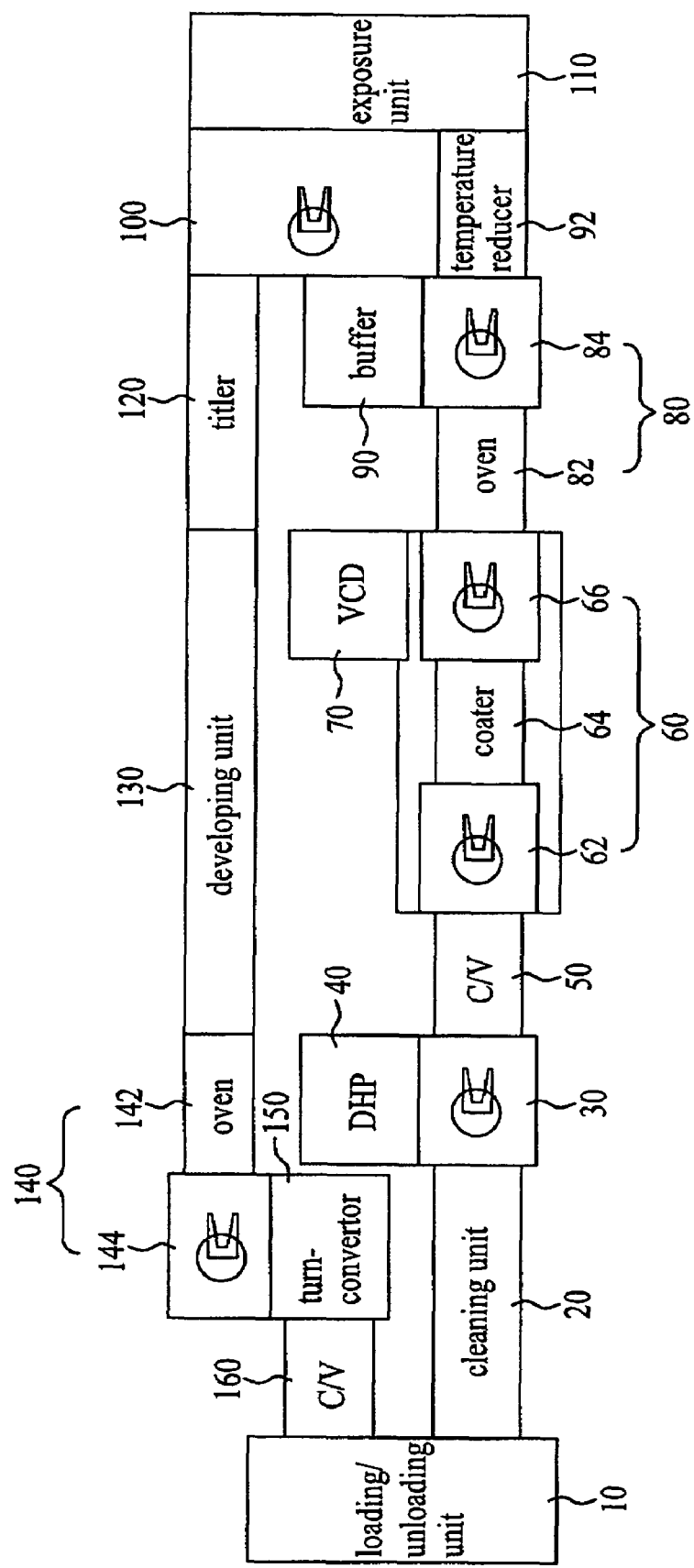
FIG. 1 is a layout schematically illustrating a related art photo apparatus.
Figure 2:
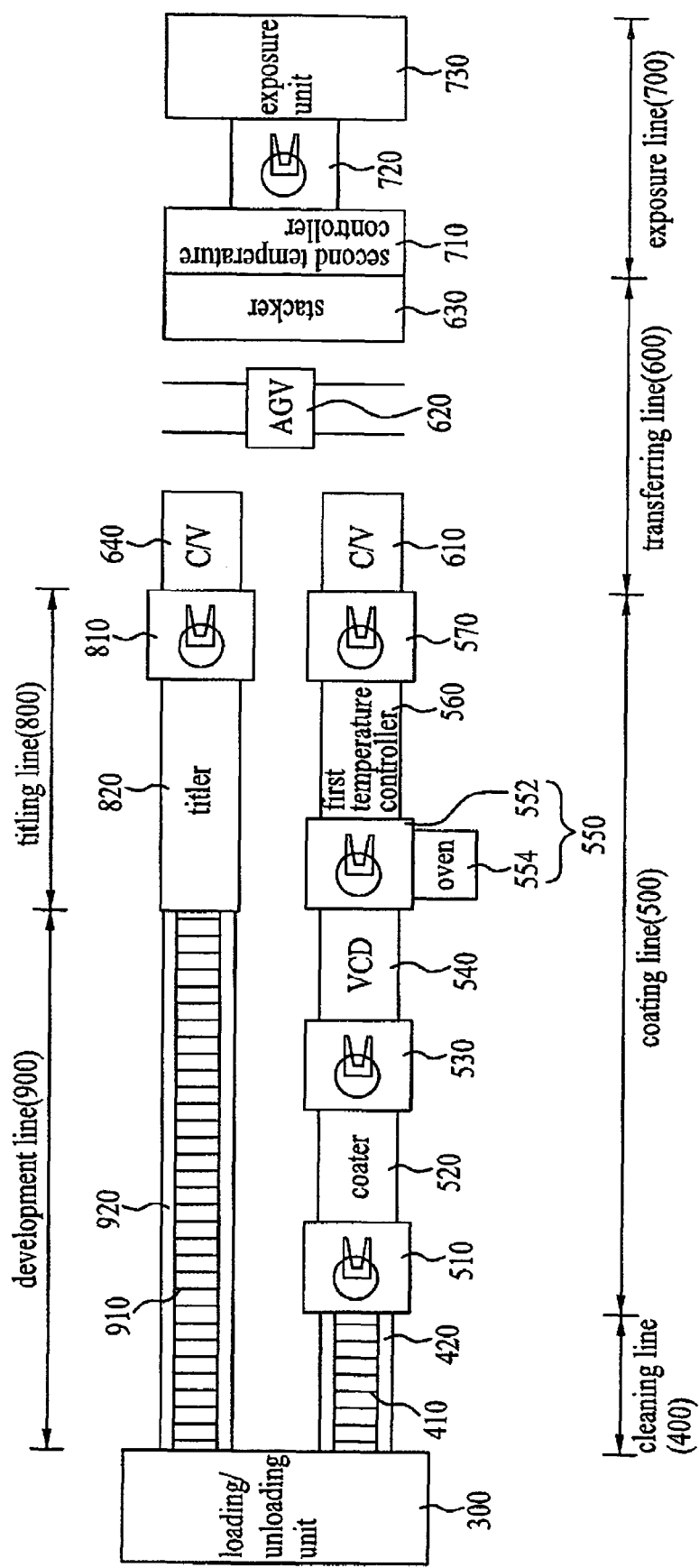
FIG. 2 is a layout schematically illustrating a photo apparatus according to one preferred embodiment of the present invention.

FIG. 2 is a layout schematically illustrating a photo apparatus according to one preferred embodiment of the present invention.

Referring to FIG. 2, the photo apparatus according to one preferred embodiment of the present invention includes: a loading/unloading unit 300 that loads or unloads a substrate; a cleaning line 400 that cleans the substrate; a coating line 500 that coats the cleaned substrate with photoresist; an exposure line 700 that exposes the photoresist coated onto the substrate; a titling line 800 that forms an identification code in the exposed substrate; a transferring line 600 that temporarily stores the substrate coated with the photoresist and transfers the same to the exposure line 700, or temporarily stores the exposed substrate and transfers the same to the titling line 800; and a development line 900 that develops the substrate via the titling line 800, and loads the developed substrate into the loading/unloading unit 300.

The loading/unloading unit 300 loads the substrate onto the cleaning line 400 after taking the substrate out of a cassette moved by a transferring device. Also, the loading/unloading unit 300 takes the substrate out from the development line 900 and then loads the substrate into the cassette. In this case, although not shown, the loading/unloading unit 300 includes at least one robot arm that loads and unloads the substrate.

In the meantime, the loading/unloading unit 300 may include a loading part that has a robot arm for loading the substrate onto the cleaning line 400 and an unloading part that has a robot arm for unloading the exposed substrate from the development line 900. Using the loading/unloading unit 300 including the loading part and the unloading part, it is possible to decrease a processing time for the loading and unloading of the substrate.

The cleaning line 400 cleans the substrate unloaded from the loading/unloading unit 300. The cleaning line 400 includes a cleaning conveyor 410 that conveys the substrate to the coating line 500 and a cleaning unit 420 that cleans the substrate by spraying a cleaning solution to the substrate.

The coating line 500 includes a first robot arm 510 that takes the cleaned substrate out of the cleaning conveyor 410; a coater 520 that coats the substrate loaded by the first robot arm 510 with the photoresist; a second robot arm 530 that takes the substrate coated with the photoresist out of the coater 520; a vacuum dryer (VCD) 540 that hardens the photoresist coated onto the substrate loaded by the second robot arm 530; a solvent remover 550 that removes solvent from the substrate on which the photoresist is hardened; a first temperature controller 560 that lowers the temperature of the substrate from which the solvent is removed; and a third robot arm 570 that takes the substrate having the lowered temperature out of the first temperature controller 560.

The first robot arm 510 takes the cleaned substrate from the cleaning conveyor 410 and loads the cleaned substrate into the coater 520. The coater 520 may rotational or irrotational method to coat the photoresist on the substrate loaded by the first robot arm 510.

After the coater 520 coats the substrate with the photoresist, the second robot arm 530 takes the substrate coated with the photoresist out from the coater 520 and loads the substrate into the vacuum dryer 540.

The vacuum dryer 540 dries the photoresist of the substrate loaded by the second robot arm 530 using a low-vacuum state, whereby the photoresist of the substrate is hardened.

The solvent remover 550 includes a fourth robot arm 552 that takes the substrate on which the photoresist is hardened out of the vacuum dryer 540 and a solvent-removing oven 554 that removes the solvent from the substrate by using a soft-bake hot plate (SHP).

The fourth robot arm 552 takes the substrate on which the photoresist is hardened out of the vacuum dryer 540 and loads the substrate into the solvent-removing oven 554. Also, the fourth robot arm 552 takes the substrate, from which the solvent is removed, out of the solvent-removing oven 554 and loads the substrate into the first temperature controller 560.

The solvent-removing oven 554 heats the substrate loaded by the fourth robot arm 552 at a temperature between about 110° and about 130° using the SHP, to thereby remove the solvent from the substrate.

The first temperature controller 560 heats or cools the substrate loaded by the fourth robot arm 552, to thereby the substrate temperature to about 23°. The first temperature controller 560 may be formed in a dual-layered structure.

After the temperature of the substrate is decreased by the first temperature controller 560, the third robot arm 570 takes the substrate out of the first temperature controller 560 and loads the substrate into the transferring line 600.

The transferring line 600 a first conveyor 610 that conveys the substrate loaded by the third robot arm 570; a second conveyor 640 that conveys the exposed substrate to the titling line 800; a stacker 630 that temporarily stores the coated substrate conveyed by the first conveyor 610 and temporarily stores the substrate exposed in the exposure line 700; and a transferring unit (AGV) 620 that transfers the substrate between the first and second conveyors 610 and the stacker 630.

The first conveyor 610 conveys the coated substrate that is loaded by the third robot arm 570 to the cassette shown in the drawings.

As the transferring unit 620 is moved along a predetermined path between the first conveyor 610 and the stacker 630, the transferring unit 620 stores the cassette, in which the plurality of substrates are accommodated, in the stacker 630. During movement of transferring unit 620 along a predetermined path between the second conveyor 640 and the stacker 630, the transferring unit 620 supplies the cassette, which accommodates the plurality of substrates exposed in the stacker 630, to the second conveyor 640.

The stacker 630 temporarily stores the cassette that accommodates the plurality of substrates coated with the photoresist and conveyed by the transferring unit 620. Also, the stacker 630 temporarily stores the cassette that accommodates the plurality of substrates exposed by the exposure line 700.

The second conveyor 640 takes the exposed substrate out from the cassette conveyed by the transferring unit 620 and conveys the exposed substrate to the titling line 800.

The exposure line 700 includes: a second temperature controller 710 that receives the cassette including the plurality of substrates from the stacker 630 and maintains the temperature of the substrate at a value that is appropriate for the exposure process; a fifth robot arm 720 that takes the substrate out from the second temperature controller 710; and an exposure unit 730 exposes the substrate loaded by the fifth robot arm 720.

The second temperature controller 710 heats or cools the substrate accommodated in the cassette, so that the substrate has a temperature of about 23°. The second temperature controller 710 is formed in a dual-layered structure. Meanwhile, the second temperature controller 710 includes a particle-removing unit that sprays high-pressure air onto the substrate in order to remove particles from the substrate.

The fifth robot arm 720 takes the substrate out of the second temperature controller 710 and loads the substrate to the exposure unit 730. Also, after completing the exposure process, the fifth robot arm 720 takes the exposed substrate out of the exposure unit 730 and loads the exposed substrate to the cassette provided in the stacker 630.

The exposure unit 730 arranges the substrate loaded by the fifth robot arm 720 and applies the light onto the arranged substrate so as to pattern the photoresist thereon.

The titling line 800 includes a sixth robot arm 810 that takes the substrate from the second conveyor 640 and a titler 820 that forms the identification code in the substrate loaded by the sixth robot arm 810. The sixth robot arm 810 takes the exposed substrate off of the second conveyor 640 and loads the exposed substrate into the titler 820. The titler 820 forms an identification code for the substrate on one side of the substrate loaded by the sixth robot arm 810. At this time, the titler 820 is installed on the conveyor, so as to form the identification code on the substrate.

The development line 900 includes a development conveyor 910 that conveys the substrate having the identification code and a development unit 920 that develops the substrate by spaying a developer onto the substrate.

The development conveyor 910 conveys the substrate having the identification code to the loading/unloading unit 300 from the titler 820.

The development unit 920 sprays the developer onto the substrate conveyed by the development conveyor 910. Accordingly, the substrate exposed by the exposure unit 730 and the titler 820 is developed by the developer sprayed from the development unit 920.

In the photo apparatus and method according to the present invention, the cleaning line 400 and the coating line 500 are arranged in one line, whereby the substrate coated with the photoresist is temporarily stored in the transferring line 600, and the substrate stored in the transferring line 600 is supplied to the exposure line 700, to thereby proceed with the exposure process. Then, the substrate exposed by the exposure line 700 is temporarily stored in the transferring line 600, and the substrate stored in the transferring line 600 is supplied to the titling line 800, whereby the titling process proceeds. After that, the substrate is supplied to the development line 900, so as to perform the development process, and then the substrate is unloaded externally.

In the photo apparatus and method according to the present invention, the coating line 500, the exposure line 700 and the development line 900 are arranged separately from one another. In this state, the transferring line 600 is provided to convey the substrate among the coating line 500, the exposure line 700 and the development line 900, to thereby decrease the entire layout of the photo-process line. Also, even though the coating line 500, the development line 600 and the exposure line 700 have the different processing times from one another, it is possible to decrease the entire processing time of the photo line by temporarily storing the substrate in the transferring line 600. Even if there are the problems in any one line, these bad effects do not effect the entire process line, so that it is possible to enhance the rate of operation.

Figure 3:
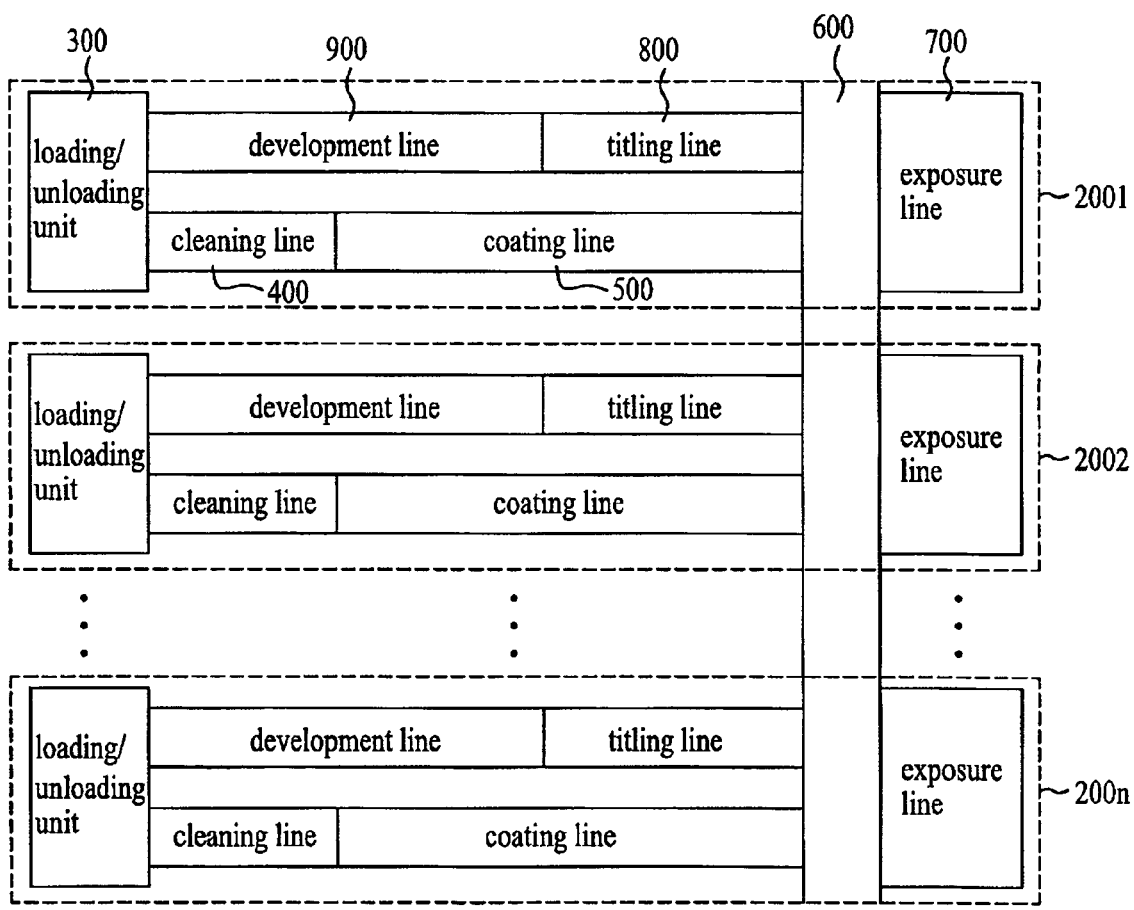
FIG. 3 is a layout schematically illustrating a photo apparatus according to another preferred embodiment of the present invention.

As shown in FIG. 3, the photo apparatus according to the present invention includes the plurality of photo-process lines (2001 to 200n) arranged in parallel.

Each photo-process line (2001 to 200n) is the same in structure as the photo apparatus shown in FIG. 2. Among the coating line 500, the exposure line 700 and the development line 900, the exposure line 700 has the largest process time period, and the development line 900 has the shortest process time period. Thus, in order to minimize the processing time in each line, it is possible to control the number of lines. For example, if the exposure line 700 is arranged by 12-lines, the cleaning line 400 and coating line 500 arranged in one line are formed by 9-lines, and the titling line 800 and development line 900 arranged in one line are formed by 6-lines, to thereby maximize the rate of operation in each line.

The transferring line 600 includes at least one transferring unit 620, wherein the transferring unit 620 transfers the substrate to the coating line 500, the exposure line 700 and titling line 800 for each photo-process line (2001 to 200n).

Referring to FIG. 3 in association with FIG. 2, at least one transferring unit 620 stores the substrate coated with the photoresist by each coating line 500 in the stacker 630. Based on the process state in each exposure line 700, the transferring unit 620 takes the substrate coated with the photoresist out from the stacker 630 and loads the substrate coated with the photoresist to the exposure line 700 of the photo-process line (2001 to 200n).

Also, at least one transferring unit 620 stores the substrate exposed by each exposure line 700 in the stacker 630. Based on the processing state for each development line 900, at least one transferring unit 620 takes the exposed substrate out from the stacker 630 and loads the exposed substrate to the titling line 800 for the photo-process line (2001 to 200n).

In the photo apparatus according to another embodiment of the present invention, a plurality of photo-process lines (2001 to 200n) are arranged by separately providing a coating line 500, an exposure line 700 and a development line 900. In this case, the substrate is transferred to each photo-process line (2001 to 200n) by using the transferring line 600, to thereby decrease the entire layout. Also, the substrate is conveyed based on the processing state for each photo-process line (2001 to 200n), so that it is possible to decrease the entire processing time. Even if there are the problems in any one line, it has no effect on the entire process line because the other photo-process line (2001 to 200n) substitutes for the line having the problems, so that it is possible to increase the rate of operation.

As mentioned above, the photo apparatus and method according to the present invention has the following advantages.

First, the coating line, the exposure line and the development line are arranged separately. In this state, the substrate is transferred among the coating line, the exposure line, and the development line by using the transferring line, to thereby decrease the entire layout of the photo-process line.

Even though the coating line, the development line and the exposure line have the different processing times, the substrate is temporarily stored by the transferring line, whereby the entire processing time of the photo process is decreased.

If any problems occur in any one line for each photo-process line, it does not adversely affect the other process lines, thereby enhancing the rate of operation.

Based on the processing state for each photo-process line, the substrate is transferred to thereby decrease the entire processing time of the photo process.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A photo apparatus comprising:
   a loading/unloading unit which loads or unloads a substrate;
   a coating line which coats photoresist on the substrate;
   an exposure line which exposes the photoresist coated on the substrate;
   a development line which develops the exposed substrate; and
   a transferring line which temporarily stores the substrate coated with the photoresist and loads the same to the exposure line, and temporarily stores the exposed substrate and loads the same to the development line;
   wherein the transferring line comprises a first conveyor which conveys the substrate coated by the coating line,
   a second conveyor which conveys the exposed substrate to the development line,
   a stacker which temporarily stores the coated substrate conveyed by the first conveyor, and temporarily stores the substrate exposed by the exposure line, and
   a transferring unit which transfers the substrate between the first and second conveyors and the stacker,
   wherein the transferring unit is moved alone a predetermined path between the first conveyor and the stacker, the transferring unit stores the cassette, in which the plurality of substrates are accommodated, in the stacker,
   wherein the transferring unit is moved along a predetermined path between the second conveyor and the stacker, the transferring unit supplies the cassette, which accommodates the plurality of substrates exposed in the stacker, to the second conveyor.

2. The photo apparatus of claim 1, wherein the coating line comprises:
   a first robot arm which loads the substrate;
   a coater which coats the photoresist on the substrate loaded by the first robot arm;
   a second robot arm which takes the substrate coated with the photoresist out from the coater;
   a vacuum dry which hardens the photoresist of the substrate loaded by the second robot arm;
   a solvent remover which removes solvent from the substrate being hardened by the vacuum dry;
   a first temperature reducer which reduces a temperature of the substrate from which the solvent is removed; and
   a third robot arm which takes the substrate having the reduced temperature out from the first temperature reducer, and loads the same to the transferring line.

3. The photo apparatus of claim 2, wherein the solvent remover comprises:
   a fourth robot arm which takes the substrate having no solvent out from the vacuum dry; and
   a solvent-removing oven which removes the solvent from the substrate.

4. The photo apparatus of claim 1 further comprising a titling line which forms an identification code on the exposed substrate conveyed from the second conveyor, and conveys the substrate having the identification code to the development line.

5. The photo apparatus of claim 4, wherein the titling line comprises:
   a sixth robot arm which takes the exposed substrate out from the second conveyor; and
   a titler which forms the identification code on the substrate loaded by the sixth robot arm.

6. The photo apparatus of claim 1, wherein the exposure line comprises:
   a second temperature controller which maintains the temperature of the substrate conveyed by the transferring line to be appropriate for the exposure process;
   a fifth robot arm which takes the substrate out from the second temperature controller; and
   an exposure unit which exposes the substrate loaded by the fifth robot arm.

7. The photo apparatus of claim 1, further comprising a cleaning line which cleans the substrate loaded by the loading/unloading unit, and supplies the cleaned substrate to the coating line.

8. The photo apparatus of claim 7, wherein the loading/unloading unit comprises:
   a loading part arranged in connection with the cleaning line in order to supply the substrate to the cleaning line; and
   an unloading part arranged in connection with the development line in order to convey the substrate provided from the development line to the outside.

9. A photo process apparatus comprising:
   a plurality of photo-process lines arranged in parallel, each photo-process line including a loading/unloading unit that loads or unloads a substrate, a coating line that coats photoresist on the substrate, an exposure line that exposes the photoresist coated on the substrate, and a development line that develops the exposed substrate; and
   a transferring line that transfers the substrate to the coating line, the exposure line, and the development line in each photo-process line according to a processing state of the photo-process lines,
   wherein the transferring line temporarily stores the substrate coated with the photoresist by each coating line, and loads the substrate coated with the photoresist to the exposure line for each photo-process line which requires the coated substrate; or the transferring line temporarily stores the substrate exposed by the exposure line, and loads the exposed substrate to the development line for each photo-process line which requires the exposed substrate.

10. The photo process apparatus of claim 9, wherein the transferring line includes:
    a first conveyor that conveys the substrate coated by the coating line;
    a second conveyor that conveys the exposed substrate to the development line;
    a stacker that temporarily stores the coated substrate conveyed by the first conveyor and temporarily stores the substrate exposed by the exposure line; and
    a transferring unit that transfers the substrate among the first and second conveyors and the stacker.

11. The photo process apparatus of claim 10, further including a titling line that forms an identification code on the exposed substrate conveyed from the second conveyor and conveys the substrate having the identification code to the development line.

12. The photo process apparatus of claim 11, wherein each titling line includes:
    a sixth robot arm that takes the exposed substrate out from the second conveyor; and
    a titler that forms the identification code on the substrate loaded by the sixth robot arm.

13. The photo process apparatus of claim 9, wherein each coating line includes:
- a first robot arm that loads the substrate;
- a coater that coats the photoresist on the substrate loaded by the first robot arm;
- a second robot arm that takes the substrate coated with the photoresist out from the coater;
- a vacuum dryer that hardens the photoresist of the substrate loaded by the second robot arm;
- a solvent remover that removes solvent from the substrate that is hardened by the vacuum dryer;
- a first temperature controller that reduces a temperature of the substrate from which the solvent is removed; and
- a third robot arm that takes the substrate having the reduced temperature out from the first temperature controller and loads the same to the transferring line.

14. The photo process apparatus of claim 13, wherein each solvent remover includes:
- a fourth robot arm that takes the substrate having no solvent out from the vacuum dryer; and
- a solvent-removing oven that removes the solvent from the substrate.

15. The photo process apparatus of 9, wherein each exposure line includes:
- a second temperature controller that maintains the temperature of the substrate conveyed by the transferring line to a value appropriate for the exposure process;
- a fifth robot arm that takes the substrate out from the second temperature controller; and
- an exposure unit that exposes the substrate loaded by the fifth robot arm.

16. The photo process apparatus of claim 9, wherein each photo-process line further including a cleaning line that cleans the substrate loaded by the loading/unloading unit for each photo-process line and supplies the cleaned substrate to the coating line.

17. The photo process apparatus of claim 16, wherein each loading/unloading unit includes:
- a loading part that supplies the substrate to the cleaning line; and
- an unloading part that unloads the substrate provided from the development line to the outside.

18. A photo process method that includes a plurality of photo-process lines arranged in parallel, each photo-process line including a loading/unloading unit that loads or unloads a substrate, a coating line that coats photoresist on the substrate, an exposure line that exposes the photoresist coated on the substrate, and a development line that develops the exposed substrate, a transferring line which temporarily stores the substrate coated with the photoresist and loads the same to the exposure line, and temporarily stores the exposed substrate and loads the same to the development line, comprising:
- loading the substrates onto each coating line so as to coat the photoresist on each substrate;
- temporarily storing the substrates coated in each coating line by using a transferring line that transfers the substrate to the coating line, the exposure line and the development line;
- exposing the photoresist coated on the substrate by loading the substrate onto the exposure line for each photo-process line that requires the coated substrate through the transferring line;
- temporarily storing the exposed substrate from each exposure line by using the transferring line;
- developing the exposed substrate by loading the exposed substrate onto the development line for each photo-process line through the transferring line; and
- unloading the substrate using the loading/unloading unit,
- wherein the transferring line stores the substrate coated with the photoresist by each coating line in the stacker and based on the process state in each exposure line, the transferring unit takes the substrate coated with the photoresist out from the stacker and loads the substrate coated with the photoresist to the exposure line of the photo-process line,
- wherein the transferring line stores the substrate exposed by each exposure line in the stacker and based on the processing state for each development line, at least one transferring unit takes the exposed substrate out from the stacker and loads the exposed substrate to the photo-process line.

19. The photo process method of claim 18, wherein the coating process includes:
- coating the photoresist on the loaded substrate;
- hardening the photoresist coated on the substrate;
- removing solvent from the hardened substrate;
- reducing the temperature of the substrate from that the solvent is removed; and
- supplying the substrate with the reduced temperature to the transferring line.

20. The photo process method of claim 18, further including forming an identification code on the exposed substrate supplied by the transferring line and supplying the substrate having the identification code to the development line.

21. The photo process method of claim 18, wherein the exposure process includes:
- maintaining the temperature of the coated substrate supplied by the transferring line to a value appropriate for the exposure process; and
- exposing the substrate.

22. The photo process method of claim 18, further including cleaning the substrate loaded by the loading/unloading unit and supplying the cleaned substrate to the coating line.

* * * * *